(12) United States Patent
An

(10) Patent No.: US 7,184,357 B2
(45) Date of Patent: Feb. 27, 2007

(54) DECODING CIRCUIT FOR MEMORY DEVICE

(75) Inventor: Yong Bok An, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/941,552

(22) Filed: Sep. 15, 2004

(65) Prior Publication Data

US 2005/0063243 A1   Mar. 24, 2005

(30) Foreign Application Priority Data

Sep. 19, 2003 (KR) ............ 10-2003-0065106

(51) Int. Cl.
*G11C 7/00* (2006.01)
*G11C 8/00* (2006.01)

(52) U.S. Cl. ............ 365/230.06; 365/189.08; 365/233

(58) Field of Classification Search ........ 365/230.06, 365/189.08, 233
See application file for complete search history.

(56) References Cited

U.S. PATENT DOCUMENTS

| 5,673,233 | A | * | 9/1997 | Wright et al. | ........ 365/233 |
| RE37,273 | E | * | 7/2001 | Shinozaki | ........ 365/233 |
| 6,337,809 | B1 | * | 1/2002 | Kim et al. | ........ 365/233 |
| 6,483,579 | B2 | * | 11/2002 | Koshikawa | ........ 356/233 |
| 6,489,819 | B1 | * | 12/2002 | Kono et al. | ........ 365/233 |

* cited by examiner

*Primary Examiner*—Trong Phan
(74) *Attorney, Agent, or Firm*—Ladas & Parry LLP

(57) ABSTRACT

Provided is a decoding circuit for a memory device which is improved in an operation of chip so as to enable the operation to be predictable by making a decoded result corresponding to an undefined code get a specific value. The decoding circuit for a memory device generates address signals by control signals set with a mode, and comprises a first logical circuit for decoding and outputting a result value defined by logically-combining the address signals corresponding to a first group and a second logical circuit for performing a decoding operation to have address signals with a specific value included in the defined result value by logically-combining address signals corresponding to a second group, by dividing the address signals into the first group corresponding to at least one defined result value and the second group corresponding to an undefined result value.

8 Claims, 6 Drawing Sheets

| A6 | A5 | A4 | Latency |
|----|----|----|---------|
| 0 | 0 | 0 | Reserved |
| 0 | 0 | 1 | Reserved |
| 0 | 1 | 0 | 2 |
| 0 | 1 | 1 | 3 |
| 1 | 0 | 0 | 4 |
| 1 | 0 | 1 | 5 |
| 1 | 1 | 0 | 6 |
| 1 | 1 | 1 | Reserved |

| A11 | A10 | A9 | Latency |
|-----|-----|-----|----------|
| 0 | 0 | 0 | Reserved |
| 0 | 0 | 1 | 2 |
| 0 | 1 | 0 | 3 |
| 0 | 1 | 1 | 4 |
| 1 | 0 | 0 | 5 |
| 1 | 0 | 1 | 6 |
| 1 | 1 | 0 | Reserved |
| 1 | 1 | 1 | Reserved |

DECODING CIRCUIT FOR MEMORY DEVICE

BACKGROUND OF THE INVENTION

1. Field of the Invention

The present invention relates to a decoding circuit, and more particularly to, a decoding circuit for a memory device, which is improved in an operation of chip so as to enable the operation to be predictable by making a decoded result corresponding to an undefined code become a specific value.

2. Description of the Related Art

Generally, a semiconductor memory device 10 (referring to FIG. 1D) such as SRAM, DRAM, and a Flash memory is comprised of a decoding circuit 12 which defines a control signal -for instance, CAS Latency (namely, CL) or Write recovery time (namely, tWR)- for setting an internal operation of the memory device 10 by receiving an address signal. For reference, CL denotes the minimum number of clocks from inputting a column address to outputting data and tWR denotes time from writing data in a cell to precharging the data.

For instance, the decoding circuit 12 as shown in FIG. 1D applied to CL combines an address signal applied through the fourth (A4), fifth (A5), and sixth (A6) address pins among address signals, and outputs signal corresponding to one of CL 2, 3, 4, 5, and 6. Furthermore, the decoding circuit 12 as shown in FIG. 1D applied to tWR combines an address signal applied through the ninth (A9), tenth (A10), and eleventh (A11) address pins among address signals, and outputs a signal corresponding to 2, 3, 4, 5, and 6.

Hereinafter, it will be described about the conventional decoding circuit with reference to FIGS. 1a, 1b, and 1c, and FIGS. 2a, 2b, and 2c.

FIGS. 1a, 1b, and 1c are circuit diagrams illustrating a decoding circuit for a memory device 10 applied to the conventional CAS latency CL. FIG. 1a shows a definition (truth) table for CL, (wherein A4. A5. and A6 correspond to the respective fourth, fifth and sixth address pins, wherein the "Reserved" items indicated in FIG. 1a correspond to the unspecified address signals, and "2", "3", "4", "5", and "6" items Indicated in FIG. 1a correspond to the specified address signals), FIG. 1b shows a circuit for generating an address signal used in a semiconductor memory device by a control signal (Mode REGister set: MREG) (wherein A4. A5. and A6 correspond to the respective fourth, fifth and sixth address pins, and /A4, /A5, and /A6 correspond to the respective fourth, fifth and sixth complementary address pins), and FIG. 1c shows a decoding circuit for outputting CL (wherein A4, A5, and A6 correspond to the respective fourth, fifth and sixth address pins, and /A4. /A5, and /A6 correspond to the respective fourth, fifth and sixth complementary address pins) with a specific value by combining with an address signal generated from the circuit in FIG. 1b.

For Example, if the specified address signals at the address pins A6, A5, A4 generated by control signals (MREG6, MREG5, MREG4 are (1, 0, 0) in sequence, then the value of the outputted control signal is a predetermined value corresponding to 4 clock periods of the CL as shown outputted. In FIG. 1a and in FIG. 1c as indicated by a "4".

On the other hand, if the unspecified address signals at the address pins A6, A5, A4 generated by control signals MREG6, MREG5, MREG4 in FIG. 1b are (0, 0,0), (0, 0, 1), or(1, 1, 1), CL outputted from FIG. 1c is set in an undefined state (i.e., a reserved state) as shown in FIG. 1a.

Therefore, if the address signal corresponding to the undefined CL is inputted, it can't be predicted for an output from the conventional decoding circuit. In response to this, it can't be checked for an operational condition of a memory device as well. Especially, a peak current may flow in the memory device.

Meanwhile, FIGS. 2a, 2b, and 2c are circuit diagrams illustrating a decoding circuit applied to the conventional tWR. FIG. 2a shows a definition table for tWR (wherein A9, A10, and A11 correspond to the respective ninth, tenth and eleventh address pins and /A9, /A10, and /A11 correspond to the respective ninth, tenth and eleventh complementary address pins, wherein the "Reserved" item in FIG. 2a correspond to the unspecified signals, and "2", "3", "4", "5", and "6" items in FIG. 2a correspond to the specified signals), FIG. 2b shows a circuit for generating an address signal (wherein A9, A10, and A11 correspond to the respective ninth, tenth and eleventh address pins and /A9, /A10, and /A11 correspond to the respective ninth, tenth and eleventh complementary address pins), used in a semiconductor memory device 10 by a control signal (Mode REGister set: MREG), and FIG. 2c shows a decoding circuit (wherein A9, A10, and A11 correspond to the respective ninth, tenth and eleventh address pins and /A9, /A10, and /A11 correspond to the respective ninth, tenth and eleventh complementary address pins) for outputting tWR with a specific value by combining the specified or unspecified address signal generated from the circuit in FIG. 2b.

That is, if the specified address signals at address pins A11, A10, A9 generated by control signals MREG11, MREG10, MREG9 are (1, 0, 0) in sequence, then the value of the outputted control signal is a predetermined value corresponding to 5 clock periods for tWR as shown outputted in FIG. 2a and FIG. 2c as a "5".

On the other hand, if the unspecified address signals delivered to the address pins A11, A10, A9 generated by control signals MREG11, MREG10, MREG9 are (0, 0, 0), (0, 0, 1) or (1, 1, 1), then the value of the outputted control signal is a reserved value directing the tWR in an undefined state (i.e., a reserved state) as shown in FIG. 2a.

Accordingly, if the address signal corresponding to the undefined tWR is inputted, it can't be predicted for an output from the conventional decoding circuit. In response to this, it can't be checked for an operational state of a memory device as well. Especially, a peak current may flow in the memory device.

As aforementioned, in case that an address signal which is not defined for CL or tWR is generated, the conventional decoding circuit for a memory device causes a mis-operation in a memory device.

SUMMARY OF THE INVENTION

Accordingly, the present invention has been made in an effort to solve the problems occurring in the related art, and an object of the present invention is to stabilize an operation of a semiconductor device by making a decoded result for an undefined value get a specific value, in a decoding operation by using an address signal.

Another object of the present invention is to prevent a peak current from being flown in a semiconductor device as the decoded result for an undefined value, as aforementioned, has a specific value.

The other object of the present invention is to stabilize an operation of a semiconductor device and prevent a peak current from being flown in a semiconductor device by making a decoded result for an undefined value become a specific value, in a decoding operation for performing CL function and tWR function.

In order to achieve the above object, according to one aspect of the present invention, there is provided a decoding circuit for a memory device, receiving an address signal and outputting a control signal to control an internal operation of the memory device, the decoding circuit comprising: a logical circuit outputting a signal to determine CL, tWR, and so forth for controlling the internal operation of the memory device when an address signal defined by a spec is applied, and outputting a control signal with a specific value when an undefined address signal is applied.

Here, preferably, the control signal is corresponding to CAS latency CL or Write recovery time tWR.

Furthermore, preferably, if the undefined address signal is applied, the CAS latency CL or the Write recovery time tWR is set on a specific value which is used for selecting a standard operation of a memory device.

In addition, a decoding circuit for a memory device in accordance with the present invention, from which address signals are generated by a control signal set with a mode, the address signals being divided into a first group corresponding to at least a defined result value and a second group corresponding to a undefined result value, decoding the address signals in logical combinations, the decoding circuit comprising: a first logical circuit for decoding and outputting the defined result value by logically combining the address signals corresponding to the first group; and a second logical circuit for performing a decoding operation to make the address signals have a specific value included in the defined result value by logically combining the address signals corresponding to the second group.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF PREFERRED EMBODIMENTS

Figures 1A, 1B:
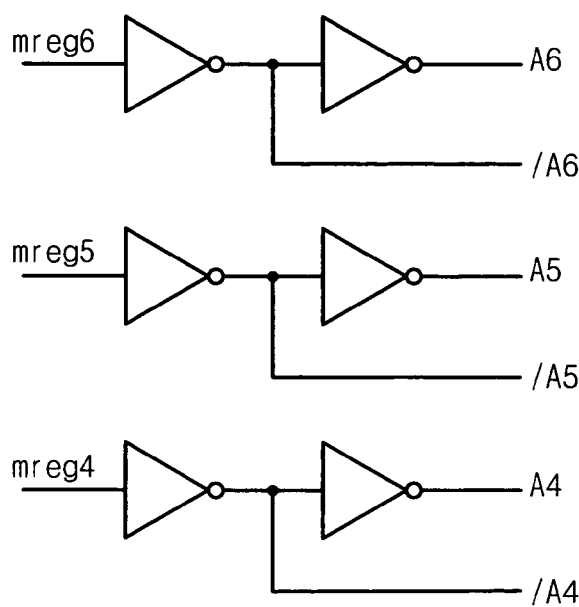
FIGS. 1a, 1b, and 1c and 1d are circuit diagrams illustrating a decoding circuit for a memory device applied to CAS latency CL.

Reference will now be made in greater detail to a preferred embodiment of the invention, an example of which is illustrated in the accompanying drawings. Wherever possible, the same reference numerals will be used throughout the drawings and the description to refer to the same or like parts.

Hereinafter, it will be described about preferred embodiments of the present invention in detail with reference to the drawings.

A decoding circuit for a semiconductor device in accordance with the present invention is schemed to decode an output to have a specific value when an undefined address signal is inputted.

For the scheme, address signals applied to the decoding circuit for the semiconductor device are divided into a first group corresponding to a defined result value and a second group corresponding to an undefined result value. The decoding circuit is comprised of a first logical circuit for outputting a result value defined by logically-combining the address signals corresponding to the first group, and a second logical circuit for performing a decoding operation to make the address signals have a specific value included in the defined result value by logically-combining the address signals corresponding to the second group.

Figures 1C, 2A:
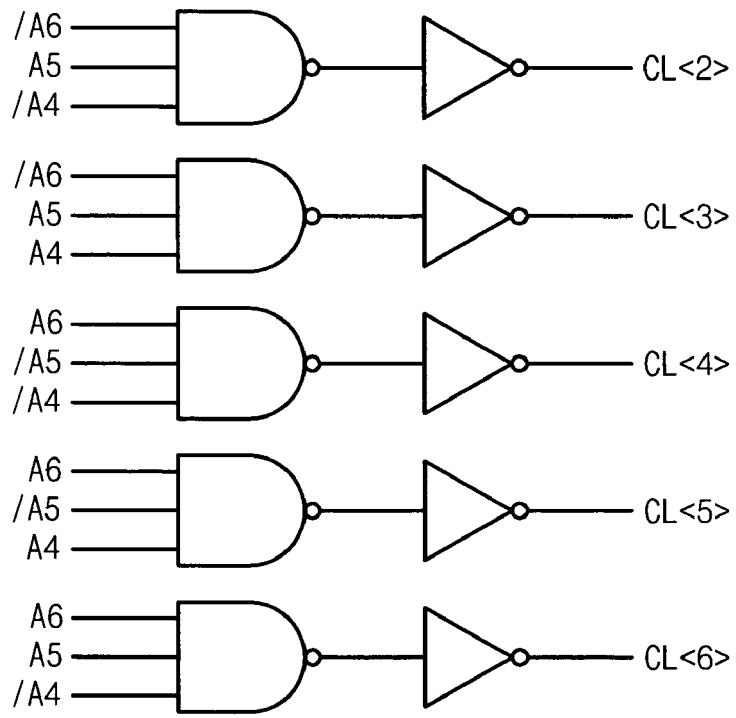
FIGS. 2a, 2b, and 2c are circuit diagrams illustrating a decoding circuit for a memory device applied to the conventional Write recovery time tWR.

Here, the first logical circuit may be schemed by such as a circuit in FIG. 1c, and describes about preferred embodiments corresponding to the second logical circuit according to the present invention.

Figure 3A:
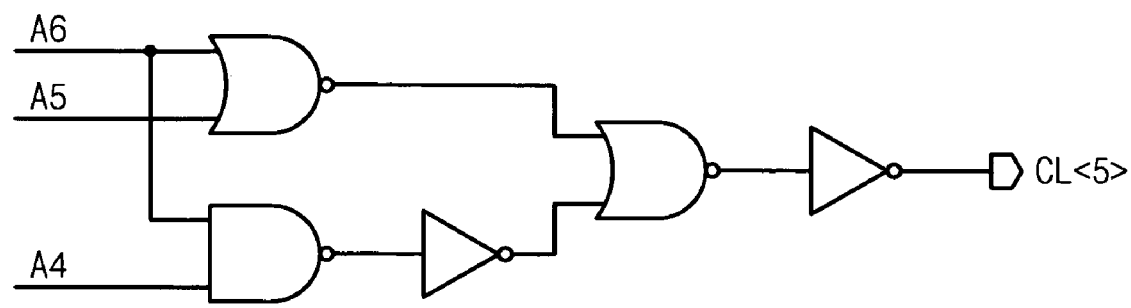
FIGS. 3a and 3b are circuit diagrams illustrating an embodiment of which a decoding circuit for a memory device in accordance with the present invention is applied to CL.
Figure 3B:
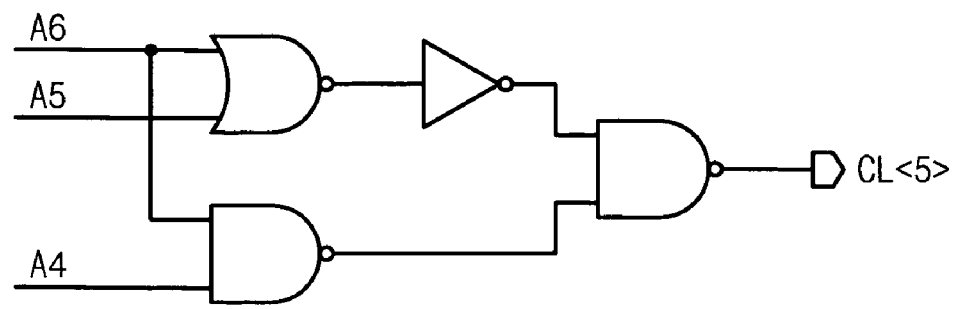
Figure 4A:
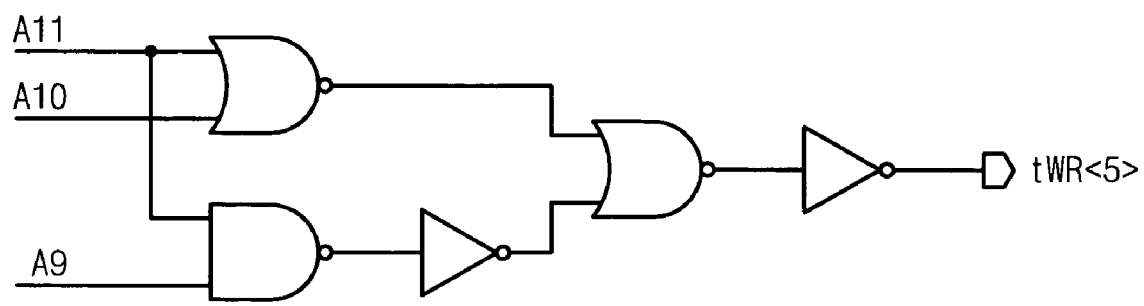
FIGS. 4a and 4b are circuit diagrams illustrating an embodiment of which a decoding circuit for a memory device in accordance with the present invention is applied to tWR.
Figure 4B:
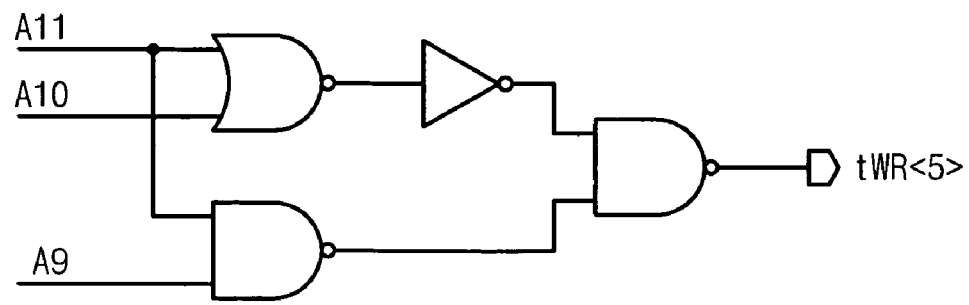

FIGS. 3a and 3b show embodiments of some of the internal operations of a decoding circuit for a semiconductor memory device 10 in accordance with the present invention, which has applied to CL (wherein A4, A5, and A6 correspond to the respective fourth, fifth and sixth address pins). FIGS. 4a and 4b show embodiments of a decoding circuit for a semiconductor memory device 10 in accordance with the present invention, which has applied to tWR (wherein A9, A10, and A11 correspond to the respective ninth, tenth and eleventh address pins).

First, with reference to FIGS. 3a and 3b, it will be described about embodiments of the decoding circuit applied to CL.

If an undefined address signal is applied in case of applying to CL, the decoding circuit outputs CL set with a specific value. That is, with reference to FIG. 1a, if address signals A6, A5, A4 are applied to (0, 0, 0), (0, 0, 1), or (1, 1, 1), the decoding circuit outputs CL with a specific value.

Figure 1D:
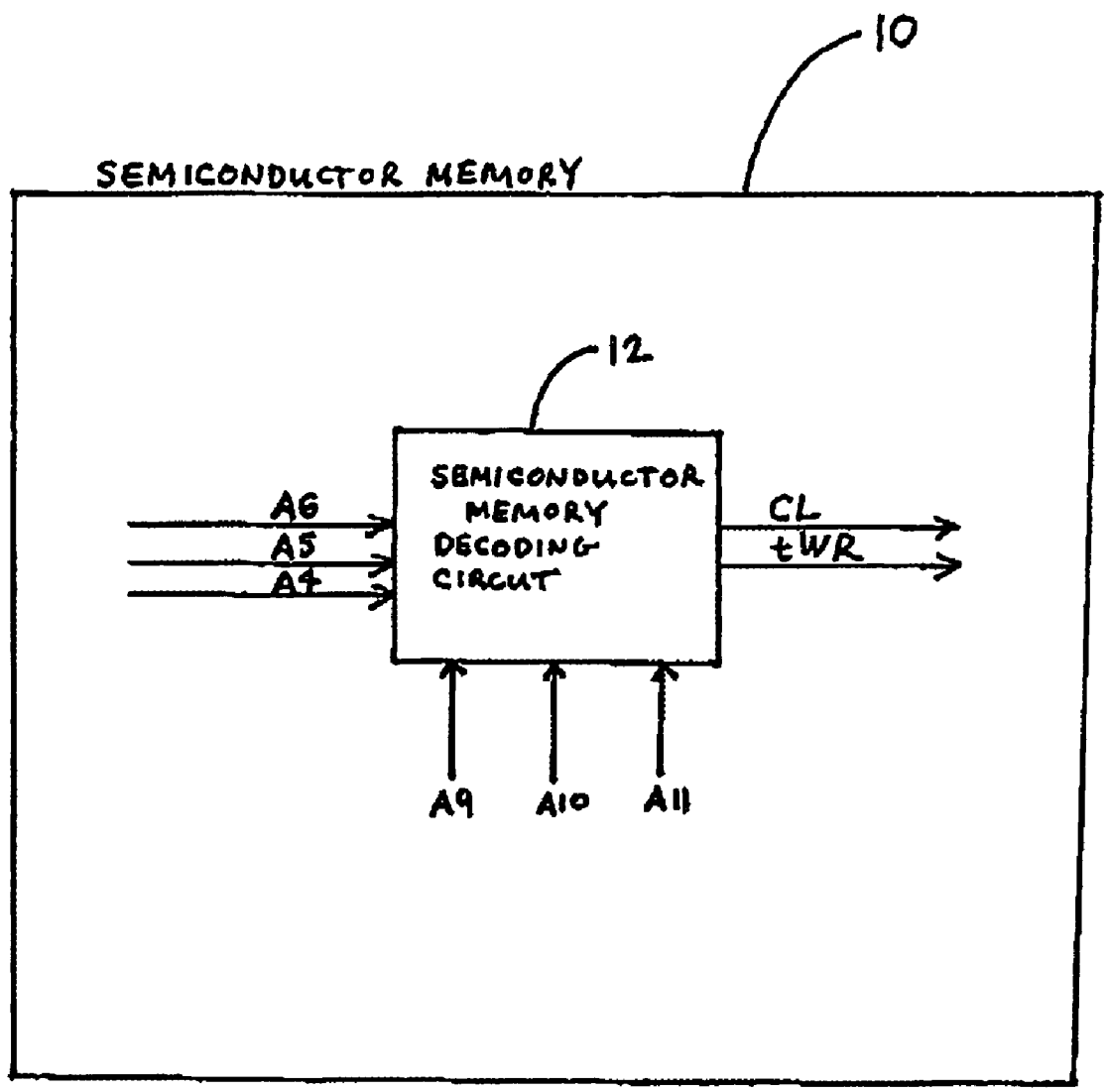
Figure 2B:
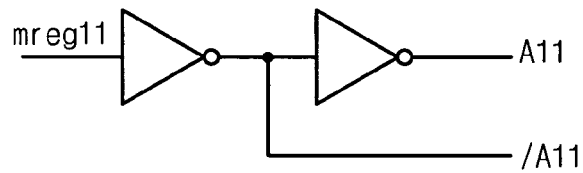
Figure 2B:
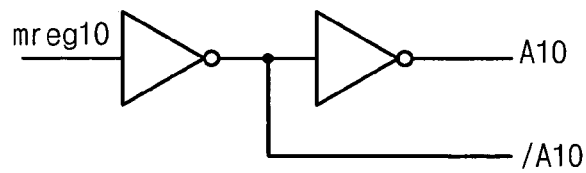
Figure 2B:
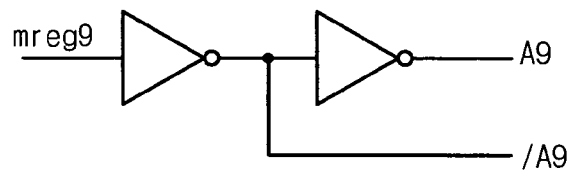
Figure 2C:
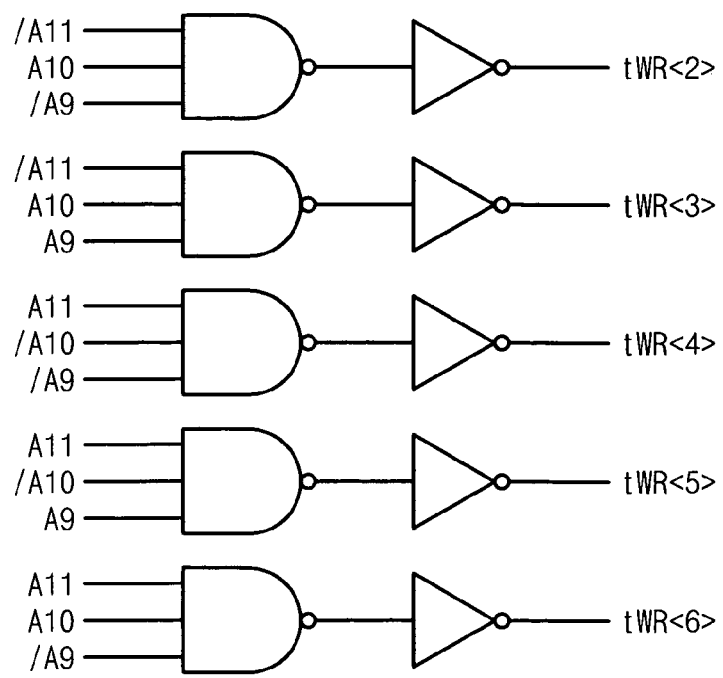

Here, the CL with a specific value represents one of values corresponding to the CL function. For instance, it is preferable to set the CL with a control signal corresponding to 5 clock periods, i.e., a "5" (tAA=15 nsec=tCK*CL) to embody function of DDR667 model of semiconductor memories which have 3 nsec for a clock period. Note that the DDR667 model memory device 10 corresponds to a commercially available semiconductor memory devices 10 as illustrated In FIG. 1d. Therefore, FIGS. 3a and 3b, as embodiments, explain that the CL is set with a control signal to correspond to 5 clock periods (indicated as a "5") if an undefined address signal is applied. That is, DDR667 model memory device 10 of semiconductor memories is designed to be operated in the state of CL=5 when an undefined address signal is applied. For reference, tAA is an address access time taken by outputting data after an address signal is applied, and tCK is a clock period.

FIG. 3a is an embodiment for a case of CL=5 corresponding to the undefined address signal, and FIG. 3b is an equivalent circuit diagram with FIG. 3a. The decoding circuit can be designed with various schemes except those in FIGS. 3a and 3b.

The decoding circuit in FIG. 3a is configured by a logical circuit to output CL=5 when an undefined address signal is applied, and the logical circuit is comprised of NOR gate, NAND gate, and inverter.

A first NOR gate receives and NOR-combines address signals A6, A5, and the NAND gate receives and NAND-combines address signals A6, A4. A first inverter inverts an output from the NAND gate, and a second NOR gate receives and NOR-combines an output from the first NOR gate and an output from the first inverter. A second inverter outputs an output from the second NOR gate by inverting it.

According to the combinations, if the address signals A6, A5, A4 are (0, 0, 0), (0, 0, 1), (1, 0, 1) or (1, 1, 1), the CL is set with "5" in the embodiment according to the present invention.

Therefore, a semiconductor device to which applies an embodiment in accordance with the present invention is operated in a state to set CL with a specific value even when an undefined address signals is applied.

It is possible to set CL with various values except setting by CL=5 according to the semiconductor device in accordance with the present invention.

FIG. 3b is an equivalent circuit with FIG. 3a, and thus possible to change to various circuits with the same function to the circuit in FIG. 3a.

On the other hand, with reference to FIGS. 4a and 4b, it will be described embodiments of a decoding circuit applied to tWR.

If an undefined address signal is applied in case of applying to tWR, the circuit outputs tWR set with a specific value. That is, with reference to FIG. 1a, if address signals A11, A10, A9 are applied to (0, 0, 0), (1, 1, 0), or (1, 1, 1), the decoding circuit outputs tWR with a specific value.

Here, the tWR with a specific value represents one of values corresponding to the tWR function. For instance, it is preferable to set the tWR with "5"(tAA=15 nsec=tCK*CL) to embody function of DDR667 memory device 10 of semiconductor memories which have 3 nsec for a clock period. Note that the DDR667 memory device 10 corresponds a commercially available semiconductor memory device 10 as illustrated in FIG. 1d. Therefore, FIGS. 4a and 4b, as embodiments, explain that the tWR is set with "5" if an undefined address signal is applied. That is, in applying the embodiment, DDR667 memory device 10 of semiconductor memories is designed to be operated in the state of tWR=5 when an undefined address signal is applied.

FIG. 4a is an embodiment for a case of tWR=5 corresponding to the undefined address signal, and FIG. 3b is an equivalent circuit diagram with FIG. 3a. The decoding circuit can be designed with various schemes except those in FIGS. 4a and 4b.

The decoding circuit in FIG. 4a is configured by a logical circuit to output tWR=5 when an undefined address signal is applied, and the logical circuit is comprised of NOR gate, NAND gate, and inverter.

A first NOR gate receives and NOR-combines address signals A9, A10, and the NAND gate receives and NAND-combines address signals A9, A11. A first inverter inverts an output from the NAND gate, and a second NOR gate receives and NOR-combines an output from the first NOR gate and an output from the first inverter. A second inverter outputs an output from the second NOR gate by inverting it.

According to the combinations, if the address signals A11, A10, A9 are (0, 0, 0), (1, 0, 0), (1, 1, 0), (1, 1, 1), the tWR is set with "5" in the embodiment according to the present invention.

Therefore, a semiconductor device to which applies the embodiment in accordance with the present invention is operated in a state to set tWR with a specific value even when an undefined address signals is applied.

It is possible to set tWR with various values except setting by tWR=5 according to the semiconductor device in accordance with the present invention.

FIG. 4b is an equivalent circuit with FIG. 4a, and thus possible to change to various circuits with the same function to the circuit in FIG. 4a.

As aforementioned, the present invention shows a decoding circuit about CL and tWR with reference to preferred embodiments. However, the present invention can be utilized variously in case of embodying a predetermined decoding circuit by using an address signal without being limited aforementioned cases.

Furthermore, if an undefined address signal is applied, the present invention has suggested embodiments set by CL=5 and tWR=5, but CL and tWR can be set with various cases by necessity.

As apparent from the above description, the present invention provides a decoding circuit for a memory device. As a result, in performing a decoding operation using an address signal, the present invention lets the decoded result for an undefined value have a specific value, which leads the semiconductor device to be stabilized by performing function corresponding to the specific value. Especially, it is advantageous to prevent an over current flow and stabilize an operation by applying to functions of CL and tWR.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A decoding circuit in a memory device, the decoding circuit receiving either a specified or unspecified address signal having one or more binary digits, and outputting a control signal having one or more binary digits to control the memory device, wherein the specified address signal is a predetermined address signal for generating a predetermined one of the control signals and wherein the unspecified address signal is not one of the predetermined address signals for generating predetermined control signals, the decoding circuit comprising:

gates receiving the specified or unspecified address signal and outputting a control signal to control a CAS latency (CL) or a write recovery time (tWR) of the memory device, wherein, when the specified address signal is inputting to the decoding circuit, the one control signal outputted is corresponding one of the control signals predetermined by the specified address signal, and wherein, when the unspecified address signal is inputted to the decoding circuit, the one control signal outputted is one control signal predetermined for output in case the unspecified address signal is received by the decoding circuit such that the memory device is capable of functioning without substantial reduction of performance characteristics even when the unspecified address signal is received by the decoding circuit.

2. The decoding circuit of claim 1, wherein the CAS latency (CL) or the write recovery time (tWR) is set to output a specific value preferable to the standard operation of a memory device having the decoding circuit when the unspecified address signal is inputted to the decoding circuit.

3. The decoding circuit of claim 2, wherein the memory device is a DDR 667 memory device controls that the CAS latency (CL) at 5 clock periods when the unspecified address signal is inputted to the decoding circuit of a DDR667 memory device.

4. The decoding circuit of claim 2, wherein the memory device is a DDR 667 memory device controls that the write recovery time (tWR) at 5 clock periods when the unspecified address signal is inputted to the decoding circuit of a DDR667 memory device.

5. The decoding circuit of claim 4, wherein the decoding circuit comprises:
   a first NOR gate for combining a first address signal with a second address signal;
   a NAND gate for combining the first address signal with a third address signal;
   a first inverter for inverting an output of the NAND gate;
   a second NOR gate for combining an output of the first NOR gate with an output from the first inverter; and
   a second inverter for inverting an output of the second NOR gate.

6. The decoding circuit of claim 4, wherein the decoding circuit comprises:
   a NOR gate for combining a first address signal with a second address signal;
   an inverter for inverting an output of the NOR gate;
   a first NAND gate for combining the first address signal of a third address signal; and
   a second NAND gate for combining an output of the inverter with an output from the first NAND gate.

7. The decoding circuit of claim 3, wherein the decoding circuit comprises:
   a first NOR gate combining the first address signal with a second address signal;
   a NAND for combining the first address signal with a third address signal;
   a first inverter for inverting an output of the NAND gate;
   a second NOR gate for combining an output of the first NOR gate with an output from the first inverter; and
   a second inverter for inverting an output of the second NOR gate.

8. The decoding circuit of claim 3, wherein the decoding circuit comprises:
   a NOR gate for combining a first address signal with a second address signal;
   an inverter for inverting an output of the NOR gate;
   a first NAND gate for combining the first address signal of a third address signal; and
   a second NAND gate for combining an output of the inverter with an output form the first NAND gate.

* * * * *